United States Patent [19]

Curtis et al.

[11] Patent Number: 4,812,756

[45] Date of Patent: Mar. 14, 1989

[54] CONTACTLESS TECHNIQUE FOR SEMICONDUTOR WAFER TESTING

[75] Inventors: Huntington W. Curtis, Chelsea; Min-Su Fung, LaGrangeville; Roger L. Verkuil, Wappingers Falls, all of N.Y.

[73] Assignee: International Business Machines Corporation, Armonk, N.Y.

[21] Appl. No.: 89,648

[22] Filed: Aug. 26, 1987

[51] Int. Cl.[4] ........................................... G01R 31/00
[52] U.S. Cl. ............................ 324/158 R; 324/158 D; 250/492.2
[58] Field of Search .......... 324/158 D, 158 R, 73 PC; 250/492.2, 492.21

[56] References Cited

U.S. PATENT DOCUMENTS

| | | | |
|---|---|---|---|
| Re. 29,918 | 2/1979 | Verkuil | 324/158 D |
| H 000111 | 8/1986 | Flesner | 324/158 D |
| 3,748,579 | 7/1973 | Henry et al. | 324/158 D |
| 3,995,216 | 11/1976 | Yun | 324/158 R |
| 4,168,432 | 9/1979 | Williams et al. | 250/370 |
| 4,253,059 | 2/1981 | Bell et al. | 324/73 R |
| 4,258,077 | 3/1981 | Mori et al. | 250/492.2 |
| 4,325,025 | 4/1982 | Corcoran et al. | 324/158 R |
| 4,326,165 | 4/1982 | Szedon | 324/158 R |
| 4,415,851 | 11/1983 | Langner et al. | 324/51 |
| 4,509,012 | 4/1985 | Lin | 324/158 D |
| 4,542,340 | 9/1985 | Chakaravanti et al. | 324/158 R |

FOREIGN PATENT DOCUMENTS 0012408  1/1980  Japan ............................ 324/158 R

OTHER PUBLICATIONS

"A Convenient Method for Non-Contact P.C.D. Lifetime Testing of Thin Silicon Wafers", by Verkuil et al., Electrochem. Soc. Abst. #615, pp. 1542–1545.
"Direct Measurement of Flat-Bond Voltage in MOS by Infrared Excitation", by Yun, Appl. Phys. Lett. vol. 21, #5, 9/1/72, pp. 194–195.
"Injection and Removal of Ionic Charge at Room Temperature Through the Interface of Air with SiO2", by Woods et al, J. Appl. Phys. vol. 44, #12, 12/73, pp. 5506–5511.
"Zur Temperaturabhangigkert . . . ", by Gysae et al, Z. Physik vol. 115, pp. 296–308, 1140.
"A Contactless Method for High-Sensitivity Measurement of p-n Junction Leakage", by Verkuil et al., IBM J. Res. & Devel, vol. 24, #3, 5/80, pp. 370–377.
"Uses of Corona Discharges in the Semiconductor Industry", by Comizzoli, J. Electrochem. Soc., Solid-State Science and Technology, 2/87, pp. 424–429.
"A Simple, Low Cost Non-Contact Method of Measuring Bulk Minority Carrier Diffusion Length", by Verkuil, Electrochem. Soc. Abst. #193, pp. 507–509.
"Contactless Alternatives to MOS Charge Measurements", by Verkuil, Electrochem. Soc. Abst, #525, pp. 1312–1315.

Primary Examiner—Reinhard J. Eisenzopf
Assistant Examiner—W. Burns
Attorney, Agent, or Firm—William T. Ellis; Aziz M. Ahsan

[57] ABSTRACT

A contactless technique for semiconductor wafer testing comprising: depositing charges on the top surface of an insulator layer over the wafer to create an inverted surface with a depletion region and thereby a field-induced junction therebelow in the wafer, with an accumulated guard ring on the semiconductor surface therearound. The technique further includes the step of changing the depth to which the depletion region extends below the inverted semiconductor wafer surface to create a surface potential transient, and the step of measuring a parameter of the resultant surface potential transient. This technique may be utilized to make time retention and epi doping concentration measurements. It is especially advantageous for reducing the effects of surface leakage on these measurements. In a preferred embodiment, corona discharges are used to effect the charge deposition configuration. Either corona discharge or photon injection are used to change the depletion region depth.

12 Claims, 4 Drawing Sheets

CONTACTLESS TECHNIQUE FOR SEMICONDUTOR WAFER TESTING

BACKGROUND OF THE INVENTION

The present invention relates generally to the field of semiconductor wafer testing, and more particularly, to a non-contact method for testing such wafers.

There are a variety of important measurements that must be made on a semiconductor wafer to determine whether it is suitable for further device processing and to make process adjustments. Examples of such measurements include doping concentration measurements, MOS time retention measurements, and general leakage measurements. However, present measurement techniques have repeatability problems,and those techniques that utilize metal-oxide-semiconductor structures to make the measurements destroy the wafer under test.

The invention as claimed provides a method for facilitating and performing a variety of non-contact measurements on a semiconductor wafer. The claimed method features steps which minimize wafer surface leakage effects.

SUMMARY OF THE INVENTION

Briefly, the present invention comprises a contactless measurement method for testing a semiconductor wafer with an insulator layer disposed thereover, comprising the steps of:

depositing charges on the top surface of the insulator layer to create an inverted surface with a depletion region and thereby a field-induced junction in the semiconductor wafer therebelow, with an accumulated guard ring on the semiconductor wafer surface therearound;

changing the depth to which the depletion region extends below the inverted semiconductor wafer surface to create a surface potential transient; and measuring a parameter of the resultant surface potential transient between the top surface of the insulator layer and the bulk of the semiconductor wafer.

In a preferred embodiment of the present invention, the charge depositing step may comprise the step of depositing charges by means of corona discharge. This corona discharge step may include the deposition of a first corona discharge on the top surface of the insulator layer in a first area to accumulate the first area surface; in combination with the deposition of a second corona discharge on the top surface of the insulator layer in a second area within and surrounded by the first area so that the first area provides an accumulated surface guard ring around the second area, with the second corona discharge creating an inverted surface second area on the semiconductor wafer with a depletion region and thereby a field-induced junction in the wafer therebelow.

In one embodiment of the present invention, the depletion depth changing step may comprise the step of applying a second corona discharge on the top surface of the insulator layer above the inverted surface area. The measuring step may then comprise the step of measuring the time decay rate of the surface potential transient resulting therefrom. These steps result in a time retention measurement.

In a further embodiment of the present invention, the depletion depth changing step may comprise the step of imposing a forward bias pulse across the field-induced junction. In one embodiment, this pulse imposing step may comprise the step of injecting photons into the depletion region to generate electron-hole pairs therein; and the measuring step may comprise the step of measuring the decay rate of the photo-voltage generated across the field-induced junction.

In a further embodiment of the present invention, the depletion depth changing step may include the step of pulsing the semiconductor wafer above the depletion region deeper into depletion relative to the steady state depletion resulting from the corona discharge step. The measuring step may then include the step of measuring the approximate instantaneous surface potential transient between the top surface of the insulator layer and the bulk of the semiconductor wafer; and measuring the surface potential between the top surface of the insulator layer and the bulk of the semiconductor wafer after the instantaneous surface potential has substantially decayed. In this embodiment, the pulsing step may be realized by the corona discharge deposition of charges on the top surface of the insulator layer above the field-induced junction to cause the depletion region in the semiconductor wafer to momentarily increase in depth.

DETAILED DESCRIPTION OF THE PREFERRED EMBODIMENT

Figure 1:
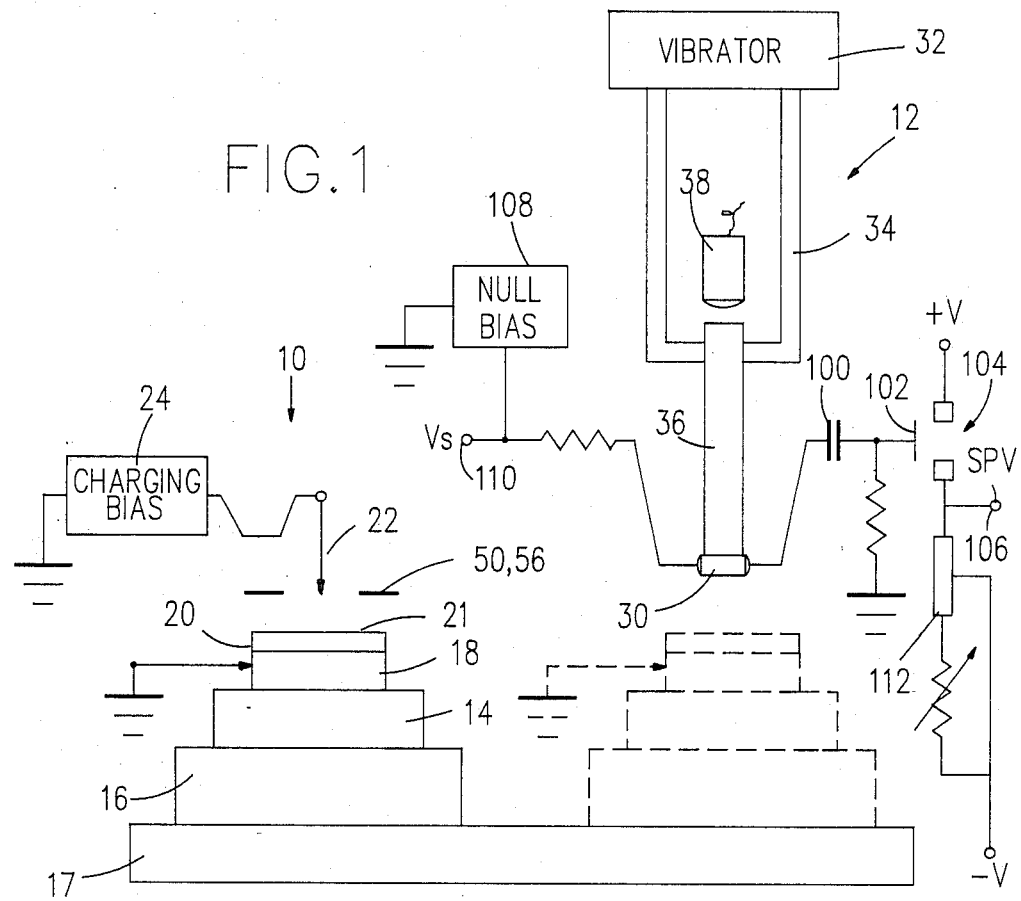
FIG. 1 is a schematic diagram of apparatus which may be utilized to implement the present invention.

The present invention will be disclosed in the context of the apparatus shown in FIG. 1. However, the present invention is a method. As such, it is not limited to any particular apparatus or tooling, but may be carried out with a variety of different charging and measurement tools.

Referring now to FIG. 1, the apparatus shown includes two principal parts: a charge deposition station 10, and a measurement station 12. The charge deposition station 10 comprises a chuck 14 disposed on a movable slide 16. A semiconductor wafer 18 to be tested is grounded and is disposed on the chuck 14. A layer of insulator 20 such as a thermally grown oxide is formed over the top surface of the wafer 18. Disposed over the oxide surface is an apparatus for depositing charge on the surface 21 of the oxide 20. In the embodiment of the invention shown in FIG. 1, this charge depositing apparatus comprises a corona discharge structure including a corona discharge needle 22 which is connected to a charge biasing means 24. In many applications, it is desirable to have a uniform charge deposition onto the surface of the oxide 20. Such a uniform charge deposition may be accomplished by providing one or more corona needles 22 which are disposed parallel to the top surface 21 of the oxide 20. In a preferred embodiment, a biased focus electrode housing may be used in conjunction with the one or more needles 22 to provide additional focusing. In order to ensure charge uniformity, these one or more corona needles 22 should be disposed a distance above the surface of the oxide layer 20 to ensure that fringing effects and other causes of charge deposition non-uniformity are minimized. Typically, such a distance is on the order of several centimeters above the surface 21. The charge deposition will be carried out through a plurality of different sized masks 50, 56 disposed over the surface of the oxide layer 20. The spacing of the masks 50, 56 should be about 10 mils above the wafer for surface 21 to provide good charging definition and uniformity.

The measurement station 12 may be comprised simply of a means for measuring the voltage changes between the top surface of the oxide layer 20 and the bulk of the semiconductor wafer 18. In the embodiment shown in FIG. 1, this voltage measuring means may simply comprise a Kelvin probe apparatus. Kelvin probe apparatus are well known in the art and are disclosed in more detail in the reference B. Gysae and S. Wagener: Z. Physin, 115, 296 (1940). A typical Kelvin probe apparatus comprises a vibrating pick-up plate 30 connected to a vibrating apparatus 32 by means of arms 34. The vibration of the pick-up plate 30 relative to the wafer surface 21 induces a time varying charge on the surface of the pick-up plate 30, at the vibration frequency of the vibrating apparatus 32. The vibration frequency is proportional to the potential difference between the pick-up plate 30 and the oxide surface 21. The time varying charge on the pick-up plate 30 is AC coupled, via a coupling capacitor 100, to the gate 102 of a high input impedance MOSFET 104, resulting in a time varying output voltage at the SPV terminal 106, thereof. Automatic null bias circuitry 108 is included to sense the time-varying voltage and to adjust the voltage Vs at its terminal 110 to be equal and opposite in polarity to the potential difference between the pick-up plate 30 and the oxide surface 21. This operation produces a null condition at the SPV terminal 106. At the null condition, the bias output terminal 110 has a voltage Vs which approximates the surface voltage on the oxide surface 21, relative to the semiconductor wafer 18 (excluding work function differences between the pick-up plate 30 and the semiconductor wafer 18). Note that a constant current source JFET 112 is included in the source leg of the MOSFET 104 to aid in maintaining a high input impedance to the gate 102.

For some measurements, it may be desirable to apply photons to the semiconductor wafer 18. In order to facilitate such photon application, the capacitive pick-up plate 30 may be chosen to be optically transparent and a glass wave guide 36 may be utilized to propagate light from an optical source such as a light emitting diode (LED) 38 through the capacitive pick-up plate 30 to the surface of the insulator layer 20. In a preferred embodiment, this structure may comprise an optical fiber wave guide 36 with one end thereof coated to a thickness of on the order of 100Å with a conductive material such as tin oxide to form the capacitive pick-up plate 30.

In one embodiment, a high speed slide track 17 may be utilized to transport the slide 16 and the chuck 14 containing the semiconductor wafer between the charge deposition station 10 and the measurement station 12. Typically, the transport between these two stations may take place in less than 50 msecs. Alternatively, the charge deposition apparatus may be configured to be movably interchanged with the measurement apparatus with the semiconductor wafer remaining stationary.

There are a variety of important measurements that must be made on the semiconductor wafer 18 in order to determine its suitability for further device processing. These measurements include a number of different voltage and charge measurements made on the semiconductor surface and on the insulator surface. However, the interface between the semiconductor and the oxide is typically leaky. In general, there are a variety of mechanisms including the generation-recombination centers on the semiconductor surface (surface states) which are active and contribute to this surface leakage. Accordingly, voltage and charge measurements made at these uncontrolled surfaces may not have the accuracy required in order to make process adjustments and to determine device suitability for further processing.

Figure 2:
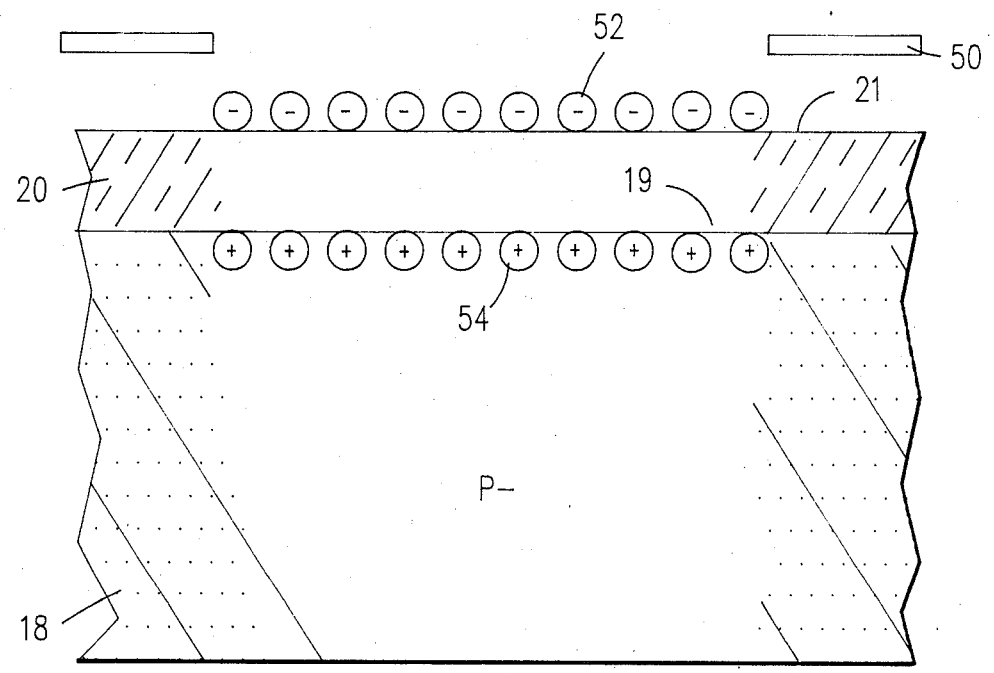
FIG. 2 is a schematic diagram of a cross-section of an oxide-semiconductor structure after a corona charging step to accumulate the silicon surface.

In order to facilitate voltage and charge measurements on a semiconductor wafer with an insulator layer disposed thereover, charges are deposited on the top surface of the insulator layer to create an inverted surface with a depletion region and thereby a field-induced junction in the semiconductor wafer therebelow, with an accumulated guard ring on the semiconductor wafer surface therearound. There are a variety of techniques which may be utilized to achieve this type of charge deposition. By way of example, but not by way of limitation, the above-described charge deposition may be accomplished by means of a corona discharge. For example, a first corona discharge may be utilized to deposit charges on the top surface of the insulator layer in a first area to accumulate a first area surface. This type of surface accumulation is shown in FIG. 2 for the example of a P- epi semiconductor wafer. This semiconductor wafer may be a post epi reoxidation product or test wafer. A tungsten needle corona discharge gun may be disposed 2.5 cm above the oxide 20 surface, with the needle connected to a ±8 Kv voltage source. The sign of the ±8 Kv voltage source controls the sign of the resultant ionized room ambient gas molecules that will be deposited on the insulator surface 21 of the wafer under test. For the P- epi wafer shown in FIG. 2, the sign of the voltage source is negative and the resultant negative ionized ambient gas molecules are deposited on the insulator surface 21 through a mask 50. In the example shown in the Figure, this mask 50 may have an aperture of 1.92 cm. The result of this first corona discharge is the deposition of the negative charges 52 onto the top surface 21 of the insulator in a first aperture defined by the mask 50. In this example for a P- doped semiconductor, a sufficient number of majority carrier holes 54 migrate to the surface 19 of the semiconductor 18 in order to image the negative charge 52 on the other side of the insulator layer 21.

The next step in obtaining this charge deposition configuration is to deposit charge by means of a second corona discharge step on the top surface 21 of the insulator layer 20 in a second area within and surrounded by the first area so that the first area provides an accumulated surface guard ring around the second area, with the second corona discharge creating an inverted surface second area on the semiconductor wafer with a depletion region and thereby a field-induced junction in the wafer 18 therebelow.

Figure 3:
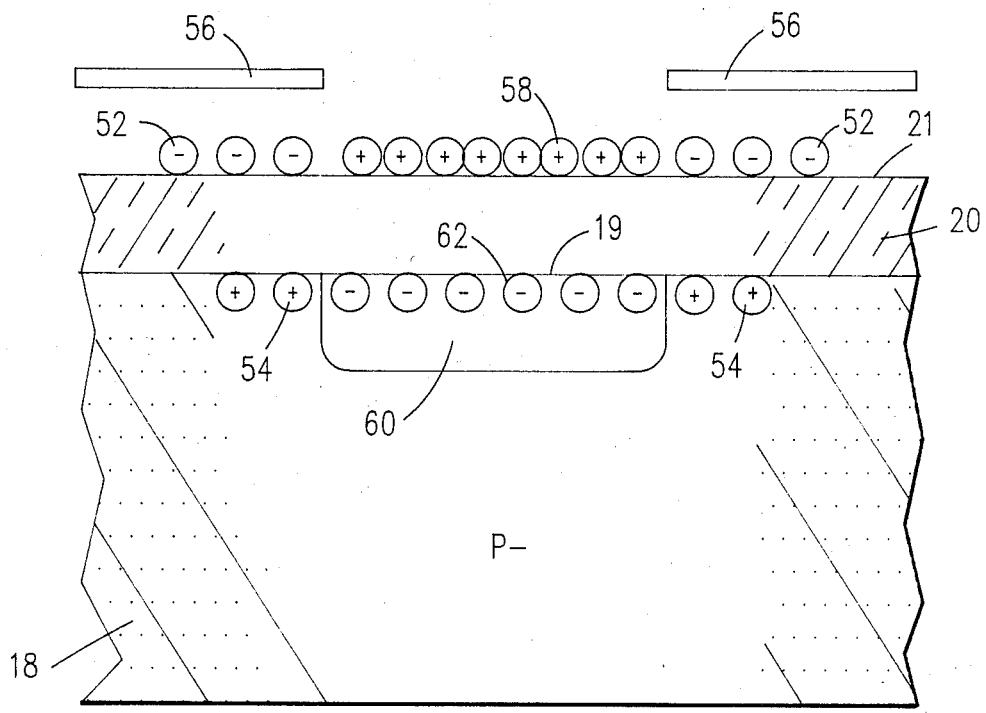
FIG. 3 is a schematic diagram of a cross-section of an oxide-semiconductor structure after a corona charging step to invert the silicon surface.

Referring to FIG. 3, this second corona discharge step may be accomplished for the example of a P-EPI semiconductor wafer by depositing a corona discharge of opposite sign to the first corona discharge through a second mask 56 which defines the second area and is smaller than the first mask 50. In the example shown in the Figure, the corona discharge comprises positive ionized gas molecules 58 of a sufficient density to neutralize the negative charge deposition 52 in this second area and to have a remaining positive charge deposition thereon. In a preferred embodiment, this second area is concentric with the first area.

The results of this second deposition is that the semiconductor wafer 18 immediately acts to image this positive charge 58 by forming a depletion region 60 where holes (the majority carrier in this example) have quickly migrated out of the region 60, leaving behind negatively ionized dopant atoms fixed in the lattice in this region. For example, if boron atoms are used as the dopant for a semiconductor wafer of silicon, then those boron atoms fixed in the lattice of the semiconductor wafer in the depletion region 60 with their extra electrons act as a negative image charge for the positive charge 58. If the positive charge 58 is sufficient, then after a period of time, a certain number of electrons migrate to the surface 19 of the semiconductor wafer to form a thin skin of electrons 62. Accordingly, after a short period of time the positive charge 58 is imaged by this thin skin of electrons 62 on the surface 19 in combination with the fixed dopant atoms in the depletion region 60 with their extra electrons.

The charge configuration shown in FIG. 3 thus comprises an inverted surface 19 on the semiconductor wafer 18 surrounded by an accumulated surface of positive charges 54. The inverted surface 19 has its active energy or surface states filled by the inversion layer electrons. Accordingly, there is minimal leakage from this inverted surface. Likewise, the accumulated surface, which is concentric with the inverted surface in FIG. 3, provides a very low leakage surface by minimizing surface generation-recombination. Accordingly, surface leakages minimally affect voltage and charge measurements taken on the top surface 21 of the oxide 20. It should be noted that the corona induced electric field in the insulator used for accumulating the epi surface to form the guard ring is approximately 2E6 volts/cm and, the insulator field used for inverting the silicon surface is approximately 2E6 volts/cm. Note that the insulator electric field is defined as the voltage across the insulator divided by the insulator thickness (volts/cm).

One important measurement that may be made using the charge deposition configuration shown in FIG. 3 is the time retention measurement for measuring the quality of the semiconductor wafer with respect to crystalline defects and contaminants which can be yield detractors in the manufacture of semiconductor circuits. For this test, a selected area of the oxidized wafer to be measured is rapidly charged by a charge of ionic current. This surface charge causes a deep depletion in the semiconductor wafer immediately below the charged area. The surface potential of this charged area may then be measured to obtain the resultant semiconductor deep depletion voltage transient. The decay of this transient is then analyzed to extract the semiconductor leakage current behavior of interest. The speed of the recovery is directly related to the number of defects in a semiconductor crystal lattice. Such defects assist electron generation to the conduction band. Thus, the greater the number of defects which may supply an electron for imaging of this additional charge, the faster will be the transient decay of the voltage.

Figure 4:
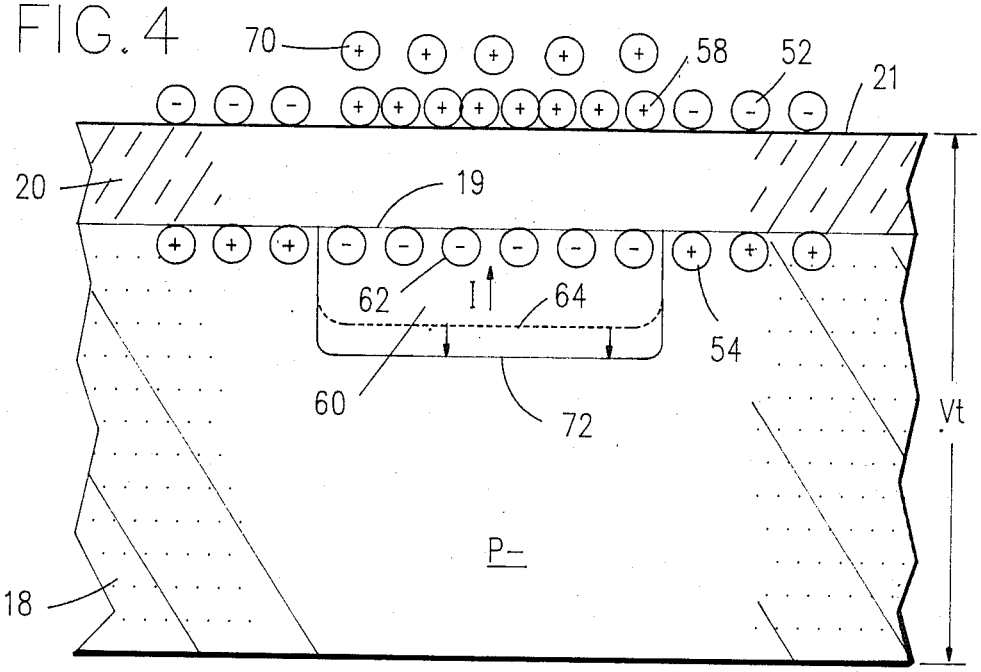
FIG. 4 is a schematic diagram of a cross-section of an oxide-semiconductor surface after a pulsing step in accordance with the present invention.

Referring now to FIG. 4, there is shown an oxidized semiconductor wafer of silicon which has undergone charge deposition in accordance with the present invention. Accordingly, an outer ring of negative charges 52 disposed on the oxide surface 21 has caused the semiconductor surface directly therebelow to become accumulated with majority carrier holes 54. Likewise, a second smaller area has been positively charged with positive ions 58 to force the underlying silicon into deep depletion. These positive ions 58 are imaged by a thin skin of electrons 62 and by the fixed ionized dopant atoms in the depletion region 60. The boundary for this imaging depletion region 60 is the dashed line 64. The apparatus utilized in order to obtain this charge disposition in the semiconductor wafer was a sharp metal needle positioned approximately 2 cm above the oxide surface 21. A high DC voltage of approximately 6 kV was applied to the needle with a positive polarity for positive charging and a negative polarity for negative charging. A gas such as room air or dry nitrogen was used as the ionizable medium. Again, a first mask with a large aperture was utilized to define the accumulated surface, while a second mask with a smaller aperture was utilized to determine the inverted surface and the deep depletion region. The integrated ion current through the mask, i.e., the quantity of deposited charge, may be monitored by a coulombmeter connected to the wafer chuck. The coulombmeter measurement requires that the wafer be ohmically connected to the wafer chuck. For this purpose, a tungsten carbide needle was employed. Feedback from the coulombmeter can be used to shut off the high voltage corona source when the desired amount of insulator surface charge is obtained. Charging times of a second or less are sufficient to cause adequate deep depletion for typical silicon leakage current values of interest.

After this charge deposition configuration has been created, a further charge deposition 70 is applied onto the surface 21 of the insulator layer 20 directly above the depletion region 60. It may be convenient to deposit this additional charge 70 through the second mask 56. In the embodiment shown in FIG. 4 with a P- epi semiconductor wafer, the additional charge deposition 70 comprises positive ions deposited by means of a corona discharge onto the surface 21 of insulator 20. Immediately after the deposition of the additional positive ions 70 onto the surface 21, the depletion region 60 increases in depth to a new boundary line 72. This additional area for the depletion regions includes a sufficient number of ionized impurities fixed in the semiconductor lattice to provide imaging for the additional positive charge 70. As electrons gradually move to the surface 19, this enlarged depletion region 60 slowly shrinks from its boundary 72 to the old boundary 64.

If the voltage is measured between the top surface of the insulator 21 and the bulk of the semiconductor wafer 18, an initial voltage change will be seen with the addition of the charges 70, and this voltage change will slowly decay back to its original voltage. The speed of this decay is a measure of the number of defects and contamination in the semiconductor wafer. In order to accomplish this measurement, the wafer is rapidly moved via the high speed slide to the measurement station before applicable deep depletion recovery occurs. At the measurement station 12, the charged wafer area is positioned directly under the capacitive pick-up plate 30 of the Kelvin probe apparatus shown in FIG. 1. The vibrating pick-up plate 30 is designed to have a somewhat smaller sensing area than that of the charged spot on the insulator which has caused the deep depletion. The Kelvin probe provides a continuous measure of the insulator surface potential beneath the probe. The Kelvin probe therefore provides a measure of the recovery of the semiconductor deep depletion voltage which is, in turn, used to determine the semiconductor leakage current behavior of interest. Note that the entire apparatus should be housed in a light-tight enclosure to prevent photo-induced leakage currents.

Figure 6:
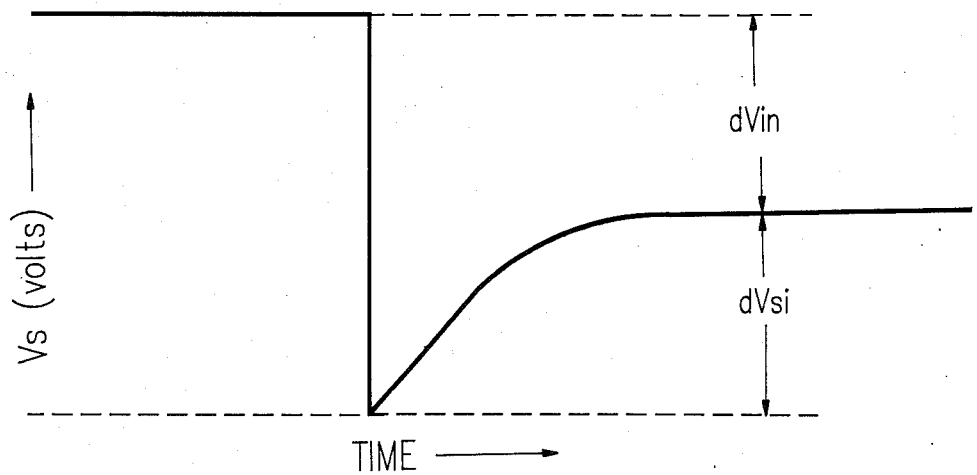
FIG. 6 is a graphical representation of $V_s$ vs time for a deep depletion time retention measurement, as well as for an epi doping concentration measurement and for silicon doping concentration in general.

Referring now to FIG. 6, there is shown a graphical representation of the voltage $V_s$ versus time. $V_s$ is the time varying potential of the insulator surface 21 with respect to the bulk of the semiconductor 18. It should be noted that the time dependent behavior of $V_s$ is identical to that of the voltage across the semiconductor $V_{si}$, since the voltage $V_{in}$ across the insulator layer 20 is constant (does not vary with time, except during the charging pulse). Accordingly for the present contactless measurement, the time-varying equation $V_{in} + V_{si} = V_s$ reduces to $V_{si} = V_s$. The steep slope in this Figure indicates the rapid charging prior to T=0. The leakage current I, may be calculated in accordance with the following equation:

$$I = \sqrt{\frac{qN_a\epsilon_o\epsilon_s}{2}} \left[\frac{1}{\sqrt{V_{si}}}\right]\frac{dV_{si}}{dt}$$

In this equation, I is the time varying minority current (electrons in the present example) which flows to the semiconductor surface 19 after the charge deposition 70 due to minority carriers that are either generated in the depletion region or diffuse to the depletion region after being generated in the bulk. Q is the value for electron charge. $N_a$ is the hole dopant concentration in the semiconductor wafer 18. $\epsilon_o$ is the permitivity of free space. $\epsilon_s$ is the relative dielectric constant of the seiconductor wafer 18. $V_{si}$ is the built-in potential at inversion, i.e., $V_{bi}$, plus the time varying potential (band bending) at the depleted silicon surface with respect to the bulk. t is time. The above-referenced equation may be derived from the conversation of charge equation $Q_{in} - Q_s - Q_b = 0$, where $Q_b$ is equal to $qN_aW$, $N_a$ is the P- bulk dopant concentration, and W is the depletion region depth. The time derivative of this charge conservation equation yields $dQ_{in}/dt - dQ_s/dt - qN_adW/dt = 0$. However, $dQ_{in}/dt = 0$ and $dQ_s/dt = I$. Accordingly, $I = -qN_adW/dt$. The previous equation for I may be realized by taking the time derivitive of W where $$W = \sqrt{\frac{2\epsilon_sV_{si}}{qN_a}}$$

This time derivitive of W may then be substituted for dW/dt in the equation for I to yield the original equation recited above for I. In this equation $Q_{in}$ is the amount of corona charge deposited on the thermal insulator surface. $Q_{in}$ is given by the time integral of the ionic corona current which flows to the wafer surface during the brief period that the high voltage is connected to the corona needle. $Q_s$ is the negative charge that accumulates at the insulator semiconductor interface. Its value is the time integral of the semiconductor leakage current of interest, I. $Q_b$ is the negative charge resulting from ionized dopant atoms in the semiconductor depletion region.

The present technique replaces a time retention measurement technique that utilized a metal electrode evaporated on the surface of an oxidized wafer in order to form a metal-oxide-semiconductor structure. The deposited metal formed one plate of a capacitor of measurable area whose time dependent capacitance, following the application of a voltage pulse which causes deep depletion, was analyzed to extract the leakage current behavior in the underlying region of depleted silicon. The present invention provides approximately the same information that is obtained by the prior art technique. However, no metal deposition is required. The physics of excitation and relaxation of the semiconductor region under test is identical to that of the MOS technique. It should be noted, though, that the MOS method monitors the time dependent behavior of $C_t$, to determine the leakage current I. $C_t$ is the total time varying capacitance measured between the deposited metal electrode and the undepleted semiconductor bulk.

It should be noted that for a system which utilizes a slide track between the charge deposition and the measurement stations, problems may arise if the insulator-semiconductor junction is especially leaky. In this case the voltage transient decays before the wafer can be moved under the Kelvin probe. An alternate method for measuring time retention of the semiconductor wafer is to change the depth to which the depletion region extends by means of a light pulse. This method has the advantage that the semiconductor wafer can be moved to the measuring station and then pulsed. Accordingly, the rate of decay of the photo voltage transient is no longer a factor in obtaining a good measurement.

Figure 5:
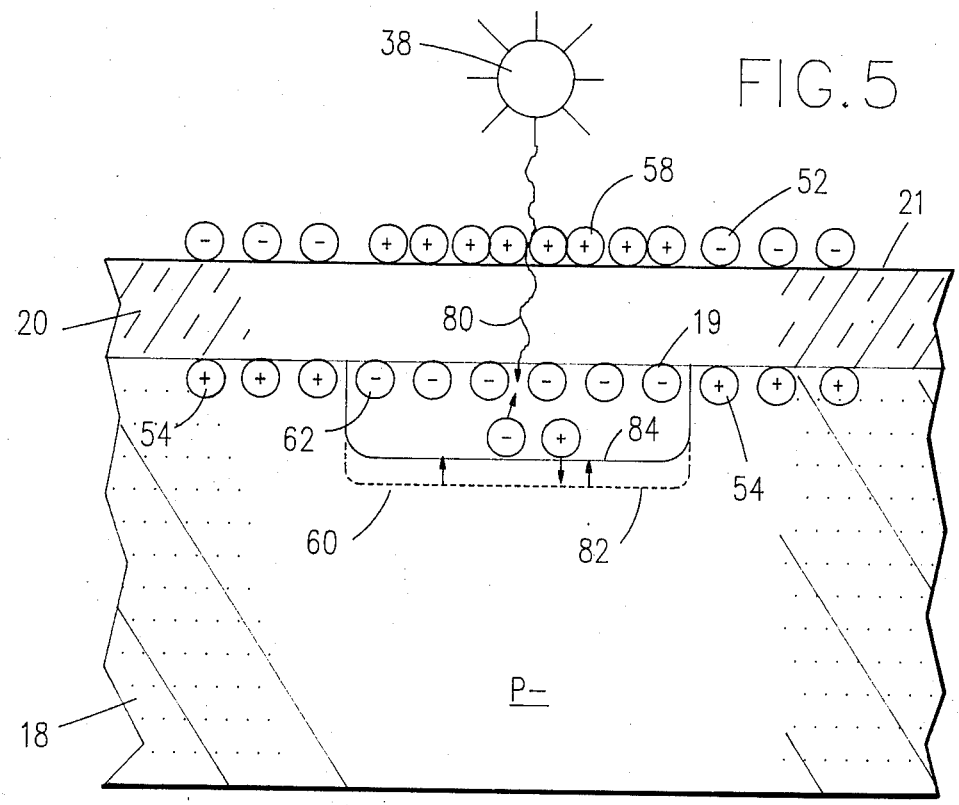
FIG. 5 is a schematic diagram of a cross-section of an oxide-semiconductor surface after a corona pulsing step in accordance with the present invention.

The same charge deposition configuration is utilized in order to facilitate this measurement technique. This charge deposition is shown in FIG. 5 and again includes an accumulated guard ring of holes 54 disposed at the insulator 20-semiconductor 18 interface around an inner inverted surface area 19 comprised of a thin skin of electrons. A depletion region 60 is disposed below the inverted thin electron skin 19.

It should be noted that the result of this charge configuration is that there is a field-induced N+/P− junction disposed horizontally across the depletion region, with this junction being surrounded by the field-induced P+ guard ring 54.

The time retention measurement in accordance with this technique is obtained by treating the induced junction as a storage capacitor and momentarily imposing a small forward bias (15-20 mv). This small forward bias may be imposed by means of a short low intensity light pulse from an LED 38, as shown in FIG. 1. The result of this light pulse is that photons 80 propagate through the insulator layer 20 and into the depletion region 60. Photons in the depletion region 60 act to create electron-hole pairs. These electron-hole pairs separate and set up their own electric field, which is opposite to the electric field already present due to the charges at the semiconductor surface 19. Accordingly, this additional opposite electric field from the electron-hole pairs acts to decrease the total electric field across the depletion region. This reduced electric field causes the depletion region to shrink from its original boundary 82 to a new shallower boundary 84. These electron-hole pairs separate with the electrons moving to the negative electron skin on the surface 19 and the holes moving toward the bottom of the depletion region 60. This change in the total voltage across the depletion region, i.e., the photo voltage, then decays so that the voltage across the depletion region returns to its original voltage. The speed of this photo voltage decay is directly proportional to how fast excess photo induced electron-hole pairs recombine in the depletion region. This recombination mechanism is again a measure of the crystal defects and contaminants in the semiconductor wafer.

By way of example, the photo voltage decay rate in accordance with the present invention was contactlessly sensed with a transparent, conductive capacitive pick-up plate 30 positioned aproximately 15 mils above an oxide surface 21. This pick-up plate was connected to a high input impedance MOSFET buffer circuit of the type shown in FIG. 1. In one experiment, 6 MOSFET wafers with 5000 Angstroms of thermal oxide were chosen to provide a wide range in MOSFET leakage. A 0.5 inch diameter corona induced PN junction was formed in the center of each wafer. Approximately a one megavolt/cm field was used to induce the isolation region or guard ring around each junction and approximately a 2 megavolt/cm field was used to induce the induced junction. The induced field conditions were monitored via oxide surface potential measurements by means of the Kelvin probe. The leakage of the corona induced junctions was determined by measuring the contactless photo voltage decay time.

Figure 7:
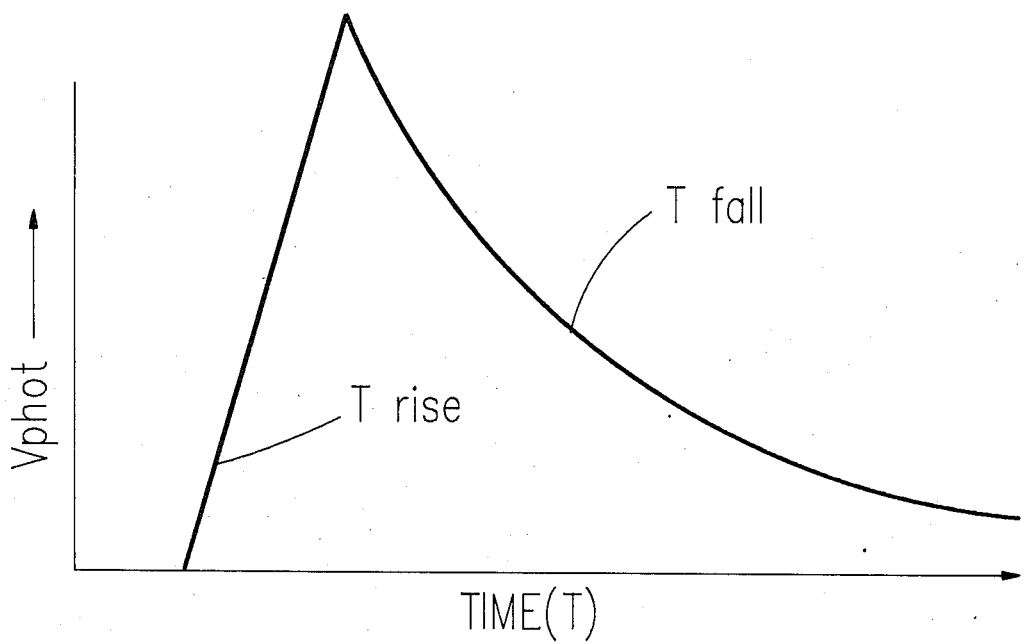
FIG. 7 is a graphical representation of V photon vs time for a photovoltage retention or decay time measurement.

FIG. 7 shows a graph of the photo voltage versus time. It has been determined via linear regression analysis of various data points that this method correlates to MOS retention time leakage measurements with a correlation coefficient of 0.965 with a confidence level of 99.9%.

The above described method utilizing photo voltage is non-destructive and can be used on product wafers after initial oxidation and after N epi oxidation. Additionally, large diameter areas can be tested without leakage influences from oxide pinholes, unlike MOS retention time measurements. It should be noted that this technique is particularly sensitive to the presence of a single semiconductor surface defect in the area tested. This sensitivity is thus advantageous for estimating surface defect densities. The method is applicable to both bipolar and FET product wafers, and is particularly advantageous as a process tool monitor for use immediately after the oxidation step following exposure to RIE, ion implantation, etc.

It should be noted again that the above described photo voltage measurement method is particularly advantageous for use with extremely leaky junctions where the voltage transient decays very quickly. In particular, with this method no movement of the wafer is required after the pulse of photons is applied.

A third important parameter which may be measured utilizing the present charge distribution configuration is the epi doping concentration on semiconductor wafer products. The doping level in the epitaxial layer affects a number of important device parameters, including barrier heights of Schottky barrier diodes, the reach-through series resistance for the transistor, the beta of lateral PNP transistors, the collector-base capacitance of NPN transistors, and the collector-emitter saturation voltage of NPN transistors. It should be noted that the capacitance parameter, in particular, has a significant role in determining the speed of the device.

In view of the effect of the epitaxial doping on the above-recited parameters, it is very important for the doping concentration to be maintained within a predetermined specification window.

Currently, there are a variety of measurements including spreading resistance, epi sheet resistance, capacitance versus voltage, C−V, Schottky diode techniques, P−N junction and MOS measurements used to estimate the epi doping concentration. However, repeatability problems associated with probe contacts pose calibration difficulties for spreading resistance and epi sheet resistance measurements. A number of the other measurements are destructive and/or have significant sample preparation time requirements.

One method for estimating epi doping concentration is to utilize monitor wafers in the reactor. However, because of uniformity problems, typically there is a doping gradient across the wafers in the reactor. Accordingly, the testing of one or more monitor wafers does not provide an accurate measure of the doping concentration of all of the wafers in the batch. Additionally, such monitor wafers take up space in the reactor, thereby decreasing the number of product wafers that can be processed in the reactor.

The epi concentration measurement technique to be described below is a direct measurement technique which may be practiced on every wafer in the batch. Moreover, the measurement may be taken conveniently immediately after the epi reoxidation step.

The apparatus shown in FIG. 1 may be utilized in order to perform the present measurement. The charge deposition step may be accomplished at the charge deposition station 10 by means of one or more corona guns. Tungsten needles may advantageously be utilized and may be connected to a ±8 kV voltage source and positioned approximately 2.5cm above the wafer surface. The sign of the ±8 kV voltage source controls the sign of the resultant ionized room ambient gas molecules that will be deposited on the oxide surface of the wafer under test. Again, by way of example, a first mask 50 which may have an aperture of 1.92 cm may be utilized to form the accumulated guard ring, while a second mask 56 with an aperture of approximately 0.96 cm may be used to define the inverted region with the induced field junction therebelow.

The Kelvin probe at the measurement station 12 may conveniently be positioned 0.5 mm above the wafer surface. The Kelvin probe is used to contactlessly measure the resultant change in the potential difference between the insulator surface 21 and the semiconductor bulk, immediately after a pulsed deposition of corona ions. The potential of the semiconductor bulk may be referenced to ground potential by using a second Kelvin probe which contactlessly monitors the backside region of the wafer surface which is not exposed to the corona ions. It is desirable that the first Kelvin probe be positioned so that it will be sensing the surface potential of the wafer at approximately the same spot where the corona induced ion beam was centered when the wafer was at the charge deposition station 10. The spacial resolution for one Kelvin probe that may be utilized is approximately 5 mm with an electrical response time of 30 msecs.

As noted above, the present measurement is taken after a field-induced N+/P− epi junction has been created with a field-induced P+ guard ring therearound. This charge distribution is obtained by a deposition through the 1.92 cm aperture of the first mask, and a second deposition through the 0.96 cm aperture of the second mask. The corona induced electric field in the insulator used for accumulating the epi surface may be on the order of 3E6 volts/cm and the field used for inversion is on the order of 2E6 volts/cm. The electric field conditions caused by the corona charging may conveniently be monitored and controlled by sequentially moving the wafer site under test to the measurement station 12 for a determination of the new insulator surface potential after each corona charging pulse. After the above-described field-induced junction is formed as shown in FIG. 3, a short depletion region depth changing step is performed.

Figure 8:
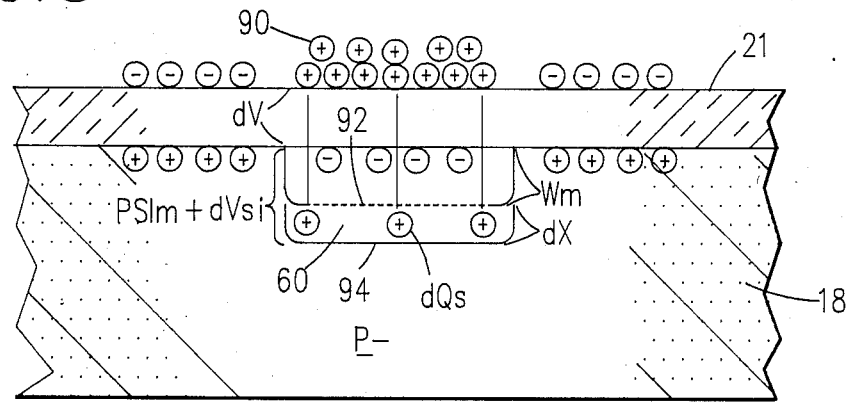
FIG. 8 is a schematic diagram of a cross-section of an oxide-semiconductor structure after deep depletion charge pulsing step in accordance with the present invention.

In one embodiment of the present invention, this depletion region depth changing step may be accomplished by pulsing the semiconductor wafer above the depletion region deeper into depletion relative to the steady state depletion resulting from the charge depositing step. In this embodiment, the pulsing may be accomplished by means of a short corona discharge pulse through the aperture of the second mask 56. In the embodiment shown in FIG. 8 for the example of a P- epi semiconductor wafer 18, the corona discharge may be utilized to deposit additional positive ions 90 onto the surface 21 above the depletion region 60. The result of this additional deposition of positive charges is that in order to image these positive charges, the depletion region 60 increases in depth from its original boundary represented by the dashed line 92, to a deeper boundary line 94. The fixed negative charges in the semiconductor wafer lattice in this added depletion area between the two boundary lines 92 and 94 provide the immediate charge imaging required by this process. The amount of this area increase is directly related to the epitaxial doping concentration of the semiconductor wafer.

Immediately following the cessation of the short corona discharge pulse, the wafer 18 under test is rapidly moved to the measurement station 12 via the high speed slide mechanism 17 in order to observe the consequent transient in the silicon surface potential along with the resultant shift in insulator surface potential. A typical $V_{si}$ transient for an oxidized epitaxial sample of silicon is shown in FIG. 6. It should be noted that the decay rate of the transient in FIG. 6 is related to the area and the perimeter dependent components of leakage of the field-induced N+/P− epi junction.

The peak amplitude of the semiconductor surface potential transient, the shift in potential across the insulator, and the insulator thickness may then be used to calculate the epitaxial doping concentration Nd from the following equation:

$$W_m = [4\epsilon_s(KT/q)/q]^{\frac{1}{2}} \cdot [Ln(N_d/N_i)/N_d]^{\frac{1}{2}}. \quad (1)$$

For the first epi doping concentration measurement, it will be assumed that the epi doping concentration is uniform from the epi surface down to and including the slight deep depletion depth addition associated with this measurement. The epi doping concentration may be calculated in a variety of different ways. A preferred way for performing this calculation utilizes an iterative solution for Nd. This solution comprises a first step of plugging in a "guess value" for Nd into equation 1 set forth above and calculating the resultant value for Wm. In equation 1, q=the unit electronic charge of 1.6 E-19 coulombs, KT/q=0.026 volts, $\epsilon_s$=the dielectric constant of the semiconductor material, 10.5E-13 farads/cm for silicon, Nd=the epi doping concentration of interest in atoms/cm$^2$, and Ni=the intrinsic carrier concentration, which is 1.6E10 carriers/cm$^2$.

The second step in this iteration comprises plugging the above "guess value" for Nd, the value of Wm calculated from step 1, and the value of dVsi from the Vs versus time measurement trace shown in FIG. 6 into equation 2 below and calculating dX.

$$dX = -Wm + Wm[1 + dV_{si}AWm^2]^{\frac{1}{2}} \quad (2)$$

For equation 2, dX is the increase in depth in centimeters of the depletion region resulting from the additional corona discharge, Wm is the original depth of the depletion region in FIG. 3 prior to the original coronal discharge, and A is equal to qNd/2Es.

The third step in the present iterative solution comprises plugging the value of dVin from the Vs versus time measurement trace shown in FIG. 6, the value of Cin, and the calculated value of dX into equation 3 set forth below and calculating Nd.

$$dQ_{in} = [C_{in} dV_{in}]/q = dQ_s = Nd \, dX. \quad (3)$$

In equation 3, dQin is the change in charge concentration on the surface 21 of the insulator 20 in ions/cm$^2$, dVs is the peak of the deep depletion transient of the semiconductor surface potential shown in FIG. 6 and labeled as 100, dQs is the instantaneous imaging of dQin by the P type dopant ions in order to satisfy charge neutrality, dVin is the shift in potential across the insulator due to the short corona pulse of charge dQin, and Cin is equal to $\epsilon_{in}/T_{in}$, where $\epsilon_{in}$ is equal to the dielectric constant of the insulator material (3.4E-13 farads/cm for oxide), and Tin is equal to the insulator thickness in centimeters.

The fourth step in this iteration comprises comparing the calculated value of Nd obtained from step 3 with the original "guess value" of Nd used in step 1. If the two values are within approximately 1% of each other, the original "guess value" for Nd is the correct value for Nd. If the two values of Nd are not within 1% of each other, then steps 1–4 are repeated with the calculated value of Nd from step 3 as the new "guess value" for Nd in step 1.

The above-described iterative solution for determining Nd may be conveniently performed by means of a computer.

Eleven experimental semiconductor wafers were used to compare this invention to a more conventional doping determination, via the MOS Cmax Cmin method. The experimental wafers utilized were taken after the post-epi oxidation step and had approximately 1600 Angstroms of thermal oxide thereon. Aluminum MOS dots were evaporated onto the product wafers and a 0.5 inch wide strip, void of dots, was reserved for contactless testing. Three contactless and three MOS measurements were performed on adjacent regions across each wafer. Good agreement between the contactless method and the MOS method for doping measurement was obtained. The 11 wafer samples utilized in the above-described test yielded a correlation coefficient of 0.997.

Accordingly, the present technique can be utilized to perform contactless epi doping concentration measurements on product wafers with a pulsed deep depletion corona discharge technique. The theory for contactless measurement is based on the assumption that epi doping is uniform from the epi surface down to and including the edge of a slight pulsed deep depletion region.

It should be noted that the present technique may be utilized to obtain an epi doping profile for the wafer by making a series of corona charge depositions of different densities with the appropriate measurements made after each charge deposition. For example, a first corona discharge may be made and the various voltage parameters measured. After the wafer has relaxed to its original depletion depth, a second bigger corona discharge may be made and the transient voltage measured. The difference in charge density $d\phi_{in}$ in the area between the first depletion depth boundary resulting from the first corona discharge and the second depletion depth boundary resulting from the second corona discharge may be determined by means of the calculation $C_{in}(dV_{in2}-dV_{in1})$. The silicon capacitance $C_s$ at $V_{si}((dV_{si2}+dV_{si1})/2)$ will be given by $d\phi_{in} \div (dV_{si2}-dV_{si1})$. Accordingly, a series of pairs of progressively changing corona discharge pulses with their attendant voltage transient measurements may be utilized to determine a doping profile throughout the semiconductor wafer as a function of depth. It is preferred that the difference in corona discharges be made small so that dVs is small and the capacitance $C_s$ is approximately constant.

It should be noted that this technique can be used to measure depletion capacitance $C_s$ as a function of the silicon deep depletion potential $dV_{si}$. Accordingly, it is possible to have a contactless pulsed C—V measurement capability.

The present epi doping measurement technique obtains measurements directly on the wafer product and is thus more representative of the product than monitor wafer testing. The present technique has excellent repeatability compared to present measurement techniques and has a faster turn around time than MOS or diode C—V measurement methods because of the elimination of sample preparation requirements.

The present technique is non-destructive. Accordingly, the present epi doping technique provides the ability to sample every wafer position in an epi reactor for monitoring process uniformity.

It should be noted that the present invention has broad applicability for testing a variety of different semiconductor materials. Likewise, the insulation material may be an oxide, a nitride, or any other convenient low leakage insulation material.

Although the present invention has been illustrated with the example of a P-Epi wafer, the invention is clearly not limited thereto. N doped wafers may also be tested.

While the present invention has been particularly shown and described with reference to preferred embodiments therefor, it will be understood by those skilled in the art that the foregoing and other changes in form and detail may be made therein without departing from the spirit and the scope of the present invention, as defined in the appended claims.

We claim:

1. A contactless measurement method for testing a doped wafer with an insulator layer disposed thereover, comprising the steps of:
    depositing charges on the top surface of said insulator layer to create an inverted surface with a depletion region and thereby a field-induced junction in the wafer therebelow with an accumulated guard ring on the wafer surface;
    changing the depth to which said depletion region extends below said inverted wafer surface to create a surface potential transition, and
    measuring a parameter of the resultant surface potential transient between the top surface of said insulator layer and the bulk of said wafer.

2. A method as defined in claim 1, wherein said charge depositing step comprises the step of depositing charges by means of at least one corona discharge.

3. A method as defined in claim 2, wherein said depletion depth changing step comprises the step of applying a second corona discharge on the top surface of said insulator layer above said inverted surface area.

4. A method as defined in claim 3, wherein said measuring step comprises the step of measuring the time decay rate of said surface potential transient.

5. A method as defined in claim 4, wherein said depletion depth changing step comprises the step of applying a second corona discharge on the top surface of said insulator layer above said inverted surface area.

6. A method as defined in claim 1, wherein said depletion depth changing step comprises the step of imposing a forward bias pulse across said field-induced junction.

7. A method as defined in claim 6, wherein said pulse imposing step comprises the step of injecting photons into said depletion region to generate electron-hole pairs therein.

8. A method as defined in claim 1, wherein said depletion depth changing step includes the steps of
    pulsing said wafer above said depletion region deeper into depletion relative to the steady state depletion resulting from said charge depositing step;
    measuring the approximate instantaneous surface potential transient between the top surface of the insulator layer and the bulk of the semiconductor wafer; and
    measuring said surface potential between said top surface of the insulator layer and the bulk of the semiconductor wafer after said instantaneous surface potential transient has substantially decayed.

9. A method as defined in claim 8, wherein said pulsing step comprises the step of depositing charges on to the top surface of said insulator layer above said field-induced junction to cause the depletion region in the semiconductor wafer to increase in depth.

10. A method as defined in claim 1, wherein said depletion depth changing step comprises the steps of:
    pulsing said semiconductor wafer with a series of pairs of pulses, with each pulse in a given pulse pair changing the depth of said depletion region to a different depth;
    measuring the approximate instantaneous surface potential after each pulse; and
    calculating a doping profile for said semiconductor wafer.

11. A method as defined to claim 10, wherein said first and second pulse steps each comprise corona-discharge depositing charges on the top surface of said insulator layer above said inverted surface area.

12. A contactless measurement method for testing a doped semiconductor wafer with an insulator layer disposed thereover, comprising the steps of:
   depositing a first corona discharge on the top surface of said insulator layer in a first area to accumulate said first area surface;
   depositing a second corona discharge on the top surface of said insulator layer in a second area within and surrounded by said first area so that said first area provides an accumulated surface guard ring around said second area, said second corona discharge creating an inverted surface second area on said semiconductor wafer with a depletion region and thereby a field-induced junction in the wafer therebelow;
   changing the depth to which said depletion region extends below said inverted semiconductor wafer surface; and
   measuring a parameter of the resultant surface potential between the top surface of said insulator layer and the bulk of said semiconductor wafer.

* * * * *